United States Patent [19]
Suguro et al.

[11] Patent Number: 5,189,503
[45] Date of Patent: Feb. 23, 1993

[54] HIGH DIELECTRIC CAPACITOR HAVING LOW CURRENT LEAKAGE

[75] Inventors: Kyoichi Suguro; Keitaro Imai, both of Yokohama; Mitsutoshi Koyama, Koganei; Kikuo Yamabe, Yokohama, all of Japan

[73] Assignee: Kabushiki Kaisha Toshiba, Kawasaki, Japan

[21] Appl. No.: 683,132

[22] Filed: Apr. 10, 1991

Related U.S. Application Data

[63] Continuation of Ser. No. 319,344, Mar. 6, 1989.

[30] Foreign Application Priority Data

Mar. 4, 1988 [JP] Japan .................... 63-049733
Dec. 22, 1988 [JP] Japan .................... 63-322064

[51] Int. Cl.$^5$ .................... H01L 29/68; H01L 27/02; H01L 29/34
[52] U.S. Cl. .................... 257/310; 257/532
[58] Field of Search .................... 357/23.11, 51, 23.6, 357/54

[56] References Cited

U.S. PATENT DOCUMENTS

| | | | |
|---|---|---|---|
| 3,633,870 | 5/1972 | Tsutsumi et al. | 357/23.15 |
| 4,636,833 | 1/1987 | Nishioka et al. | 357/51 |
| 4,811,076 | 3/1989 | Tigelaar et al. | 357/51 |
| 4,903,110 | 2/1990 | Aono | 357/51 |
| 4,937,650 | 12/1990 | Shinriki et al. | 357/51 |

FOREIGN PATENT DOCUMENTS 62-239152 9/1987 Japan .
63-49736 3/1988 Japan .

OTHER PUBLICATIONS

M. Saitoh et al., "Electrical Properties of Thin $Ta_2O_5$ Films Grown By Chemical Vapor Deposition," *IEDM Technical Digest*, (Dec. 1986), pp. 680–683.

*Primary Examiner*—J. Carroll
*Attorney, Agent, or Firm*—Foley & Lardner

[57] ABSTRACT

A dielectric insulation film consists of a metal oxide and pieces of dissimilar metal element added to the metal oxide. A positive charge number under an ionized state of the dissimilar metal element is smaller by one than that of the metal oxide. An ionic charge number of the dissimilar metal element is of a predetermined one kind. The dielectric insulation film is formed as an insulation film of capacitor of each cell of a semiconductor device according to a chemical vapor deposition (CVD) method in the process of forming cells of the semiconductor device.

12 Claims, 7 Drawing Sheets

HIGH DIELECTRIC CAPACITOR HAVING LOW CURRENT LEAKAGE

This application is a continuation, of application Ser. No. 07/319,344, filed Mar. 6, 1989 now abandoned.

BACKGROUND OF THE INVENTION

1. Field of the Invention

The present invention relates to a semiconductor device with an insulation film composed of a transition metal oxide with a high dielectric constant, and to a method of manufacturing such a semiconductor device. Particularly, the present invention relates to an insulation film of a capacitor which can drastically reduce leakage current of the capacitor.

2. Description of the Prior Art

A dynamic random access memory (DRAM) is one of the conventional semiconductor devices. The DRAM carries out information storing operations with the combination of capacitors and transistors. In the DRAM, an $SiO_2$ film which is generally formed between a capacitor electrode and a semiconductor substrate is used as a capacitor insulation film.

With rapid integration of elements, the $SiO_2$ film is thinned more and more. For example, an $SiO_2$ film of a 1-megabit DRAM has the thickness of 100 Å or thinner, and a 4-megabit DRAM employs, instead of conventional plane capacitors, trench capacitors with grooves recessed on the surface of a silicon substrate, or stacked capacitors, to increase effective the capacitor areas.

With further integration of an LSI, the area for capacitors of the LSI is reduced increasingly, while the capacitors are required to have the same capacitance as before. Therefore, only thinning the dielectric $SiO_2$ film can hardly cope with the requirements for integration.

Instead of employing a single $SiO_2$ film as an insulation film of the capacitor, there it has been proposed to use a laminated structure of an $SiO_2$ film and an $Si_3N_4$ film whose dielectric constant is larger than that of the $SiO_2$ film, or to use a laminated structure of an $SiO_2$ film, an $Si_3N_4$ film and $SiO_2$ film. A more integrated VLSI such as a 16-megabit DRAM may only be realized by developing dielectric materials having higher dielectric constants.

Among such dielectric materials having higher dielectric constants, a tantalum oxide $Ta_2O_5$ is most widely studied and developed. The reason of this is because a relative dielectric constant of $Ta_2O_5$ is 25 to 30 which is six to eight times larger than that of $SiO_2$ and three to four times larger than that of $Si_3N_4$. Therefore, a film thickness necessary for obtaining the same capacitance may be reduced by such magnitude.

However, a leak current of the $Ta_2O_5$ film is several order of magnitude larger than that of the $Si_3N_4$ film to cause a problem of drastically deteriorating a dielectric strength and the holding efficiency of a memory element.

The reason why the leak current is high in the $Ta_2O_5$ film is generally because transition metal oxide films such as the $Ta_2O_5$ film of high dielectric constant inherently have a smaller band gap compared to the $SiO_2$ film. In addition, the $Ta_2O_5$ film for example has a problem of oxygen deficiency, i.e., a deviation from a stoichiometric composition. Due to this, the composition fluctuates from stoichiometric valence. Namely, microstructural defects due to the oxygen deficiency in the film increase a leak current of the film.

To lower the, leak current of the $Ta_2O_5$ film, there has been proposed the excessive including oxygen of $O_2$ in the film to reduce an oxygen deficiency densityl, or adding nitrogen $N_2$ during the formation of the film according to a sputtering technique. These methods may only slightly improve performance of the film, not provide remarkable improvements.

If the leak current of a dielectric material is large, the charge holding function of a capacitor made from the material deteriorates even if the dielectric material has a large dielectric constant. Then, this dielectric material cannot provide a capacitor suitable for forming a memory cell.

As mentioned in the above, the conventional leak current reduction method do not provide remarkable improving effects. Therefore, a new method is needed to reduce the leak current of metal oxides having high dielectric constants.

To prevent Ta components from exceeding the stoichiometric composition, there is a method of introducing excessive oxygen during the film forming process. For example, in reactive sputtering, a Ta target is sputtered in an atmosphere of excessive oxygen and argon to form a $Ta_2O_5$ film. Then, a leak current of the $Ta_2O_5$ film may slightly be reduced.

For instance, a $Ta_2O_5$ film of 250 Å in thickness is reactively sputtered with excessive oxygen on a P-type (100) silicon substrate having a resistivity of 5 Ωcm and annealed in nitrogen at 600° C. for 60 minutes. With this film, an electric field strength of a capacitor of 0.1 mm² will be 2.1 to 2.2 MV/cm with respect to a current of $10^{-11}$ A ($10^{-9}$ A/cm²), and a breakdown electric field of the capacitor will be 5.5 to 6.2 MV/cm. Here, an upper electrode of the capacitor is pure aluminum.

Figure 1:
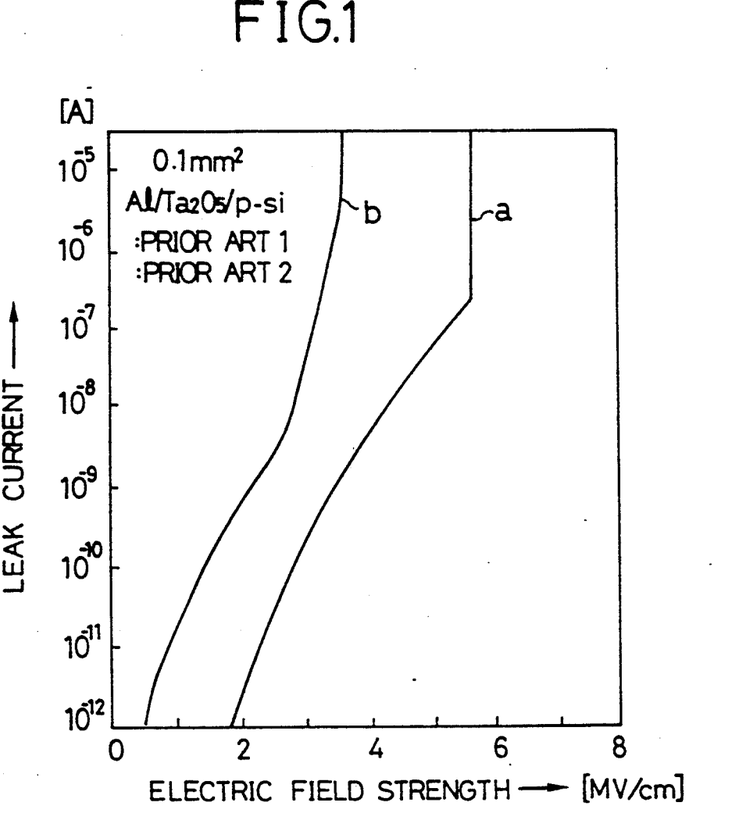
FIG. 1 is a view showing characteristic curves of leak currents and electric field strengths of conventional metal oxide films containing no additive elements.

A reference mark "a" in FIG. 1 is a characteristic curve of this sort of dielectric insulation film. A relative dielectric constant of the film is 9.0. A leak current level required for a DRAM of 4 to 16 megabits is $10^{-9}$ A/cm². These properties may be converted into $SiO_2$ equivalent properties to find an equivalent film thickness and an equivalent electric field strength. Then, 108 Å is the equivalent film thickness and 4.8 to 5.1 MV/cm as the equivalent electric field strength are obtained. From these properties, it is apparent that $Ta_2O_5$ is inferior to $SiO_2$ in terms of the leak current. The electric field strength of $SiO_2$ is 6 to 7 MV/cm.

For the further increase in the relative dielectric constant of the $Ta_2O_5$ film, a 900° C. annealing may be effective. However, the leak current is also increased by the 900° C. annealing. A reference mark "b" in FIG. 1 is an I-V characteristic curve of leak currents of the $Ta_2O_5$ film annealed in oxygen of 600° C. for 60 minutes and then in argon of 900° C. for 60 minutes. When the leak current is $10^{-9}$ A/cm², the electric field strength is 0.7 MV/cm. The relative dielectric constant is 15. Therefore, an $SiO_2$ equivalent film thickness is 65 Å and an $SiO_2$ equivalent electric field is 2.7 MV/cm. Namely, the leak current increases further by raising the annealing temperature.

To improve integration, trench capacitors or stacked capacitors are combined with transition metal oxide films having high dielectric constants. To form such oxide films, a chemical vapor deposition (CVD) method will inevitably be used because the CVD method has excellent step coverage characteristics.

When the CVD method is employed to form a tantalum oxide film, however, a stoichiometric ratio of the film greatly fluctuates from an original stoichiometric ratio of 2:5 toward a direction of causing oxygen deficiency to drastically increase the leak current of the film.

There is another problem. When a $Ta_2O_5$ film having a high dielectric constant is formed on the surface of a silicon substrate, a native silicon oxide ($SiO_2$) film having a small dielectric constant tends to be formed between the high dielectric $Ta_2O_5$ film and the silicon substrate. The reason why the $SiO_2$ film is formed at such an interface is not only because of a native oxide film existing on the surface of the silicon substrate before the formation of the high dielectric insulation film but also because oxygen (inside and outside the film) diffuses to the interface after the formation of the high dielectric insulation film. As a result, a dielectric constant of the capacitor insulation film decreases, and capacitance of the capacitor decreases to an unsatisfactory level.

Existence of such an $SiO_2$ film of low dielectric constant lowers the capacitance of the capacitor. However, if a material of high dielectric constant is used as a capacitor insulation film in order to compensate the decrease in the capacitance, the leakage current of the film may increase to deteriorate the characteristics of an element formed with the capacitor. This is because materials with high dielectric constants generally have small band gaps.

Therefore, the insulation film of high dielectric constant cannot compensate for the layer of low dielectric constant formed at the interface, because it may increase the leakage current of the capacitor to drastically deteriorate the efficiency of the element.

SUMMARY OF THE INVENTION

To cope with these problems of conventional capacitors, an object of the present invention is to provide a semiconductor device, such as a DRAM, composed of elements of improved performance, and a method of manufacturing such a semiconductor device.

Another object of the present invention is to provide capacitors suitable for VLSI chips, and a method of manufacturing such capacitors. Each capacitor is provided with an insulation film made of a metal oxide of high dielectric constant to remarkably reduce any leak current of the capacitor.

Moreover, another object of the present invention is to provide a semiconductor device of improved insulation capability, and a method of manufacturing such a semiconductor device. This semiconductor device is provided with a high dielectric insulation film which contains oxides of both tantalum and zirconium.

Still another object of the present invention is to provide an MIS capacitor or an MIM capacitor of low leak current and high dielectric constant, and a method of manufacturing such a capacitor. The MIS capacitor or the MIM capacitor is provided with an insulation film of higher dielectric constant. This insulation film is formed only at an interface between another insulation film and an electrode.

According to an aspect of the present invention, a dielectric insulation film comprises a metal oxide thin film and pieces of a metal element added to the metal oxide thin film. A positive charge number under an ionized state of the metal element is smaller than that of a metal which forms the metal oxide thin film. Particularly, the positive charge number under the ionized state of the added metal element is smaller by one than that of the metal of the metal oxide thin film, and an ionic charge number of the added metal element is of one predetermined kind.

When such a dissimilar metal satisfying the above-mentioned conditions is added to the mother metal oxide, the added dissimilar metal having the smaller ionic charge number acts as an acceptor with respect to donors generated in the mother metal oxide by oxygen holes to provide a compensating effect similar to that provided by semiconductor. Therefore, the added dissimilar metal of certain density can minimize electric conductivity of the mother metal oxide.

As mentioned in the above, the electric charge number under the ionized state of the dissimilar metal is smaller than that of the metal oxide insulation film of high dielectric constant. By adding the dissimilar metal to the metal oxide film, the donors generated by the oxygen holes in the mother metal oxide film are compensated by the accepter of the dissimilar metal, which can reduce the electric conductivity of the mother metal oxide film. This reduction in the electric conductivity may decrease a leak current of the oxide film.

Thus, there is provided a dielectric film which has a small area, a large capacitance and a low leak current and is suitable to be mounted on a semiconductor device such as a VLSI chip.

According to another aspect of the present invention, as chemical vapor deposition (CVD) method is employed to form a high dielectric insulation film which simultaneously contains oxides of tantalum and zirconium. This insulation film does not suffer from the microstructural defects due to the oxygen deficiency. Accordingly, the formed high dielectric insulation film has a low leak current and excellent dielectric strength.

As described before, a $Ta_2O_5$ film tends to deviate from the stoichiometric composition to generate the oxygen deficiency and microstructural defects to increase the leak current of the film. The leak current is increased because structural defects due to the oxygen deficiency generate conduction electrons and make a current flow easily. Particularly when the CVD method is employed, a single tantalum oxide film may deviate from its stoichiometric composition to cause an oxygen deficiency. Then, the structural defects that increase the leak current occur easily, to destabilize a film forming process and deteriorate performance of an element. Therefore, an oxygen deficiency should not lead to the structural defects.

The stoichiometric valence of the tantalum is five, while those of dissimilar metals to be added to the mother metal oxide film, e.g. zirconium, is four alone. Therefore, the structural defects due to the oxygen deficiency are compensated by the zirconium of smaller valence, and conduction electron occurrence is suppressed. By containing two kinds of elements having different valences respectively, the film will be stabilized. Namely, as zirconium has only a valence of four, the Zr-added tantalum oxide film is extremely stabilized and does not easily change. Therefore, dissimilar metals to be added to metal oxide films must have only one kind of valence. A dielectric constant of zirconium oxide $ZrO_2$ is about 23 which is slightly smaller than that of $Ta_2O_5$ which is 27. Zirconium oxide itself has a high dielectric constant so that an Ta oxide film containing zirconium is expected to have a high dielectric constant.

| metal oxide as the base of film | metals in the the film (valence) | dissimilar metals to be added (valence) |
| --- | --- | --- |
| $Nb_2O_5$ | Nb (+5, +3) | Zr (+4) |
|  |  | Hf (+4) |
| $Ta_2O_5$ | Ta (+5) | Zr (+4) |
|  |  | Hf (+4) |
| $ZrO_2$ | Zr (+4) | Sc (+3) |
|  |  | Y (+3) |
|  |  | La (+3) |
| $HfO_2$ | Hf (+4) | Sc (+3) |
|  |  | Y (+3) |
|  |  | La (+3) |
| $TiO_2$ | Ti (+4, +3) | Sc (+3) |
|  |  | Y (+3) |
|  |  | La (+3) |

This chart shows dissimilar metals satisfying such conditions that its valence is smaller than that of metal oxide (the greater valence, if there is more than one) by one and that each metal has only kind of valence, together with metal oxide as its base.

Even with the CVD method, an insulation film having a low leak current and high dielectric constant can be formed with an excellent step coverage characteristic. Thus, the present invention can provide excellent element characteristics in forming not only plane capacitors but also three-dimensional capacitors such as trench capacitors and stacked capacitors.

According to still another aspect of the present invention, capacitor insulation films comprise a first insulation film composed of a transition metal oxide having a dielectric constant higher than that of $SiO_2$ and a second insulation film having a dielectric constant which is higher than that of the first insulation film. The second insulation film is disposed between the first insulation film and an upper electrode or between the first insulation film and a lower electrode. According to this aspect, there is provided an MIS capacitor or an MIM capacitor which has a high dielectric constant, low leak current and excellent dielectric strength.

When a high dielectric insulation film, i.e., a transition metal oxide is formed on the surface of a silicon substrate, an $SiO_2$ film of low dielectric constant (3.8) is formed at an interface between the high dielectric insulation film and the surface of the silicon substrate. As a result, capacitance of a capacitor to be formed decreases because of bilayer structure.

To cope with this problem, an insulation film having a higher dielectric constant is formed only at the interface between the insulation film and an electrode, and insulation film is constituted with one having a relatively low dielectric constant. As a result, a capacitor having high capacitance and low leak current is formed. When the substrate is made of metal instead of silicon, the similar effect can be expected. Namely, without lowering the capacitance of the capacitor, he leak current can be reduced. Therefore, according to this aspect, the MIS capacitor or the MIM capacitor having a capacitor insulation film with excellent electrical characteristics can be formed.

These and other objects, features and advantages of the present invention will be more apparent from the following detailed description of preferred embodiments in conjunction with the accompanying drawings.

DETAILED DESCRIPTION OF THE EMBODIMENTS

Embodiments of a dielectric insulation film and its manufacturing method will be described with reference to the drawings.

Figure 2:
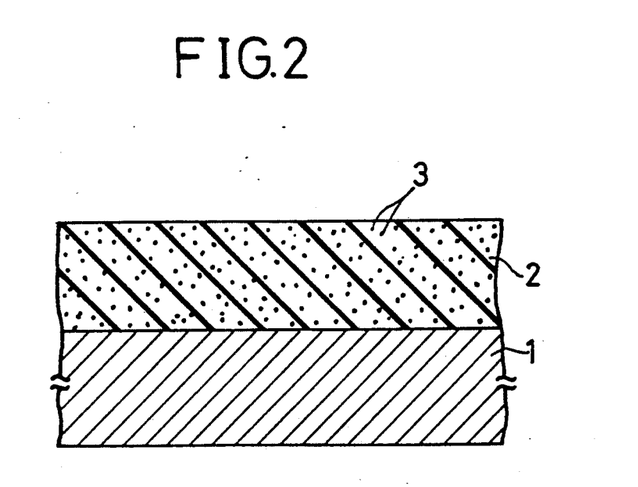
FIG. 2 is a sectional view showing constitution of a dielectric insulation film according to an embodiment of the present invention.

In FIG. 2, the dielectric insulation film of the present invention is formed on a conductive material 1, and comprises a mother metal oxide 2 and pieces of dissimilar metal 3. A charge number under an ionized state of the dissimilar metal 3 is smaller by one than that of metal of the mother metal oxide 2. The ionic charge number of the dissimilar metal 3 is, thus, predetermined.

Examples of a method of manufacturing dielectric films of the present invention will be explained with reference to FIG. 2.

EXAMPLES 1 AND 2

A target is made of Ta whose purity is 99.9999% and which contains Zr (addition of one atomic percent). The target is set in a DC magnetron spattering apparatus. A pump which is not with carbon and hydrogen systems is used to discharge the sputtering apparatus to $1 \times 10^{-5}$ Pa or less. In an atmosphere of oxygen and inert gases, e.g., oxygen and argon (50:1) of 0.5 Pa, the target is sputtered onto the P-type (100) silicon semiconductor substrate 1 whose resistivity is 5 Ωcm, as shown in FIG. 2. The thickness of a formed $Ta_2O_5$ film is 220 Å. At the beginning of the sputtering, an $SiO_2$ film of about 20 to 30 Å in thickness is formed on the silicon substrate. A dielectric constant to be explained below of the $Ta_2O_5$ film is an overall dielectric constant of the combination of the $SiO_2$ film and the $Ta_2O_5$ film.

In FIG. 2, the $Ta_2O_5$ film 2 contains the added Zr 3, which is less than five atomic percent of $Ta_2O_5$. The $Ta_2O_5$ film is heat-treated in $N_2$ of 600° C. for one hour and in $N_2$ of 900° C. for one hour.

Figure 3:
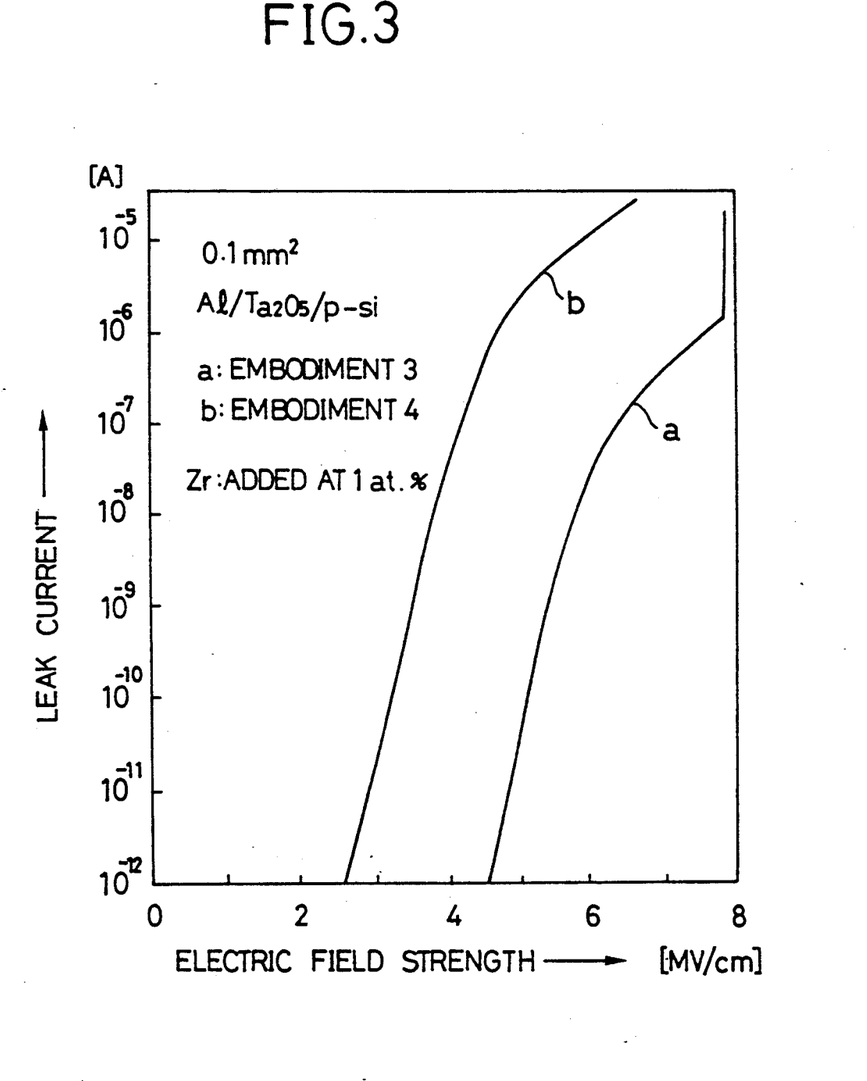
FIGS. 3 to 4 are views showing characteristic curves of leak currents and electric field strengths of examples of dielectric insulation films according to the present invention, respectively.

FIG. 3 shows characteristic curves of leak currents and electric field strengths of the $Ta_2O_5$ insulation film with negative potential applied to an aluminum gate formed on the film. A curve "a" in the figure represents the film after the 600° C. heat treatment.

Compared to the conventional examples "a" and "b" of FIG. 1, both the examples of FIG. 3 of the present invention show remarkably reduced leak currents. Particularly on the low electric field side, the leak currents are reduced by three digits compared to the conventional examples. Relative dielectric constants of the cases "a" and "b" of FIG. 3 are 9 and 15, respectively, and electric field strengths of the cases "a" and "b" for a leak current $10^{-11}$ A ($10^{-9}$ A/cm$^2$) are 4.9 MV/cm and 3.0 MV/cm, respectively. Taking the dielectric constant of $SiO_2$ into consideration, electric field strengths with respect to $SiO_2$ equivalent film thicknesses are 11.4 MV/cm for the case "a" and 11.5 MV/cm for the case "b." The $SiO_2$ equivalent film thicknesses of the cases "a" and "b" are 95 Å and 60 Å, respectively. The leak current of the Zr-added $Ta_2O_5$ films was reduced by three digits, compared with the non-added ones. Compared with $Ta_2O_5$ films which contain Ti at one atomic percent, it was reduced by about one digit in the same electric field.

Dielectric insulation films made of $Ta_2O_5$ containing Zr can be formed according to the CVD method by thermally decomposing pentaethoxytantalum and tetraethoxyzirconium. In this case, trench capacitors or stacked capacitors can be combined with insulation films of high dielectric constant to further improve integration of elements.

EXAMPLES 3 AND 4

Figure 4:
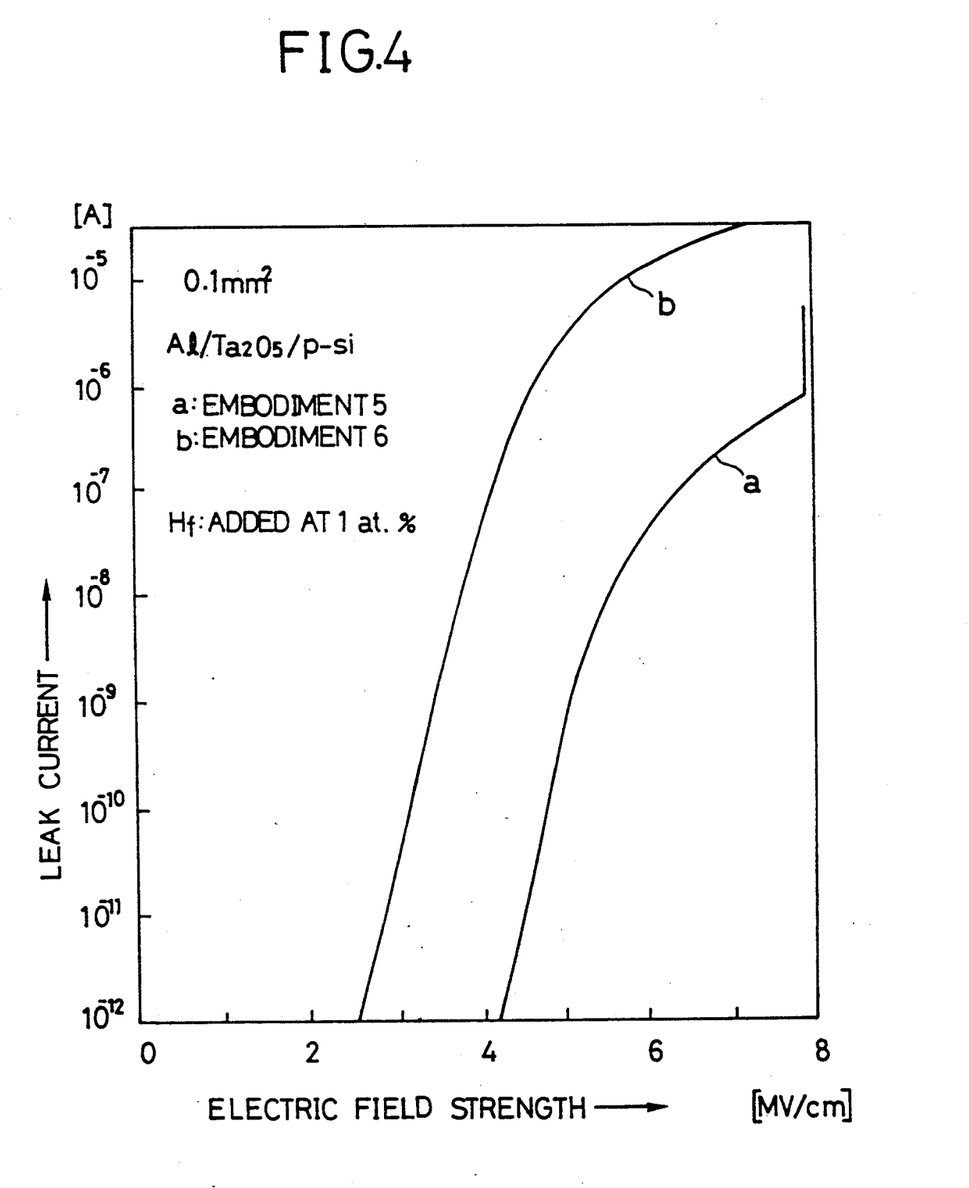

FIG. 4 is a view showing characteristic curves of leak currents and electric field strengths of $Ta_2O_5$ films containing Hf at one atomic percent.

It will be seen in the figure that Hf can provide properties similar to those provided by Zr.

EXAMPLE 5

A target is made of Nb whose purity is 99.9999% and Zr (addition of one atomic percent). The target is set in the DC magnetron sputtering apparatus. A pressure in the sputtering apparatus is reduced to $1 \times 10^{-5}$ Pa or less. The target is sputtered onto a P-type (100) silicon substrate in an atmosphere of oxygen and argon gas (50:1) of 0.5 Pa and Zr-added $Nb_2O_5$ films are formed. The thickness of a formed $Nb_2O_5$ film is 200Å. At the beginning of the sputtering, an $SiO_2$ film of 20 to 30 Å in thickness is formed on the silicon substrate. The quantity of Zr mixed in $Nb_2O_5$ is 0.8 atomic percent. The $Nb_2O_5$ film is heat-treated in $N_2$ of 900° C. for one hour, and an aluminum electrode is formed on the $Nb_2O_5$ film. Negative electric field of 5 MV/cm is applied to the aluminum electrode to measure a leak current to occur on a capacitor of 0.1 mm$^2$ formed with the $Nb_2O_5$ film. The measured leak current was $8 \times 10^{-9}$ A. This is 1/100 to 1/200 of that of a capacitor formed with an insulation film containing no Zr. A relative dielectric constant of the capacitor of the example 7 is 23.

With a target made of Nb which contains Ti at one atomic percent, an $Nb_2O_5$ film is formed to contain Ti at 0.9 atomic percent. This film has a leak current of $5 \times 10^{-8}$ A. Therefore, the leak current of the film containing Zr is 1/7 of that of the film containing Ti.

With a target made of Nb which contains Hf at one atomic percent, an $Nb_2O_5$ film is formed to contain Hf at 0.8 atomic percent. This film has a leak current of 6 to $7 \times 10^{-9}$ A with respect to 10 V. This leak current is substantially the same as that of the film containing Zr. The Hf-added $Nb_2O_5$ film has a relative dielectric constant of 22 to 23 which is similar to that of the Zr-added $Nb_2O_5$ film.

EXAMPLE 6

A mother material of this example is $ZrO_2$. A target is made of Zr whose purity is 99.999% and which contains Y at one atomic percent. The target is set in the DC magnetron sputtering apparatus. A pressure in the sputtering apparatus is reduced to $1 \times 10^{-5}$ pa or less. The target is sputtered onto a P-type (100) silicon substrate in an atmosphere of oxygen and argon (50:1) of 0.5 Pa. The thickness of a formed Y-added $ZrO_2$ film is 220 Å. The quantity of Y in $ZrO_2$ is 0.8 atomic percent. The formed film is heat-treated in $N_2$ of 600° C. for one hour, and an aluminum electrode is formed on the film. With this film, a capacitor of 0.1 mm$^2$ has a leak current of $2 \times 10^{-10}$ A with respect to 5 MV/cm. This leak current is 1/100 of that of a capacitor with an insulation film containing no Y.

When Sc or La is added at one atomic percent to Zr, leak currents also decrease. The leak currents with respect to 5 MV/cm are $4 \times 10^{-10}$ A for an Sc-added film and $5 \times 10^{-10}$ A for La-added film. Relative dielectric constants of $ZrO_2$ films containing Y, Sc and La respectively are 23, 24 and 24, respectively.

EXAMPLE 7

An $HfO_2$ film of 200 Å in thickness is a mother material of this example. This example provides a similar effect as that of the $ZrO_2$ film. Y, Sc and La are added each at one atomic percent to $HfO_2$, respectively, and heat-treated in $N_2$ of 600° C. for one hour. With the insulation films containing Y, Sc and La, respectively, capacitors each of 0.1 mm$^2$ have leak currents of $4 \times 10^{-10}$ A and $6 \times 10^{-10}$ A with respect to 5 MV/cm, respectively. These are 1/200 to 1/300 of a leak current $1.2 \times 10^{-7}$ of a capacitor with an $HfO_2$ insulation film containing no additive elements. Relative dielectric constants of the films containing Y, Sc and La respectively are 25, 26 and 26, respectively.

EXAMPLE 8

In the case of $TiO_2$, Y, Sc and La provide remarkable effects if added. They are added at one atomic percent, respectively, and formed $TiO_2$ films each of 200 Å in thickness are heat-treated in $N_2$ of 600° C. for one hour. With these $TiO_2$ films, capacitors each of 0.1 mm$^2$ show leak currents of $1 \times 10^{-9}$ A, $3 \times 10^{-9}$ A and $5 \times 10^{-9}$ A, respectively, with respect to 5 MV/cm. These are 1/200 to 1/100 of a leak current $1 \times 10^{-6}$ A of a capacitor with an insulation film not containing additive elements. Relative dielectric constants of the $TiO_2$ films containing Y, Sc and La, respectively, are 32, 33 and 35, respectively. These figures are less by 10% to 20% compared to 38 of the films with no additives. The leak current reducing effect of this example is remarkable.

With reference to FIGS. 5(a) to 5(e), a first example of manufacturing process of a DRAM having stacked capacitor cells employing the dielectric insulation films of the present invention will be explained.

In this example, a dielectric insulation film comprising a tantalum oxide which contains a zirconium oxide is formed according to the CVD method.

Figure 5A:
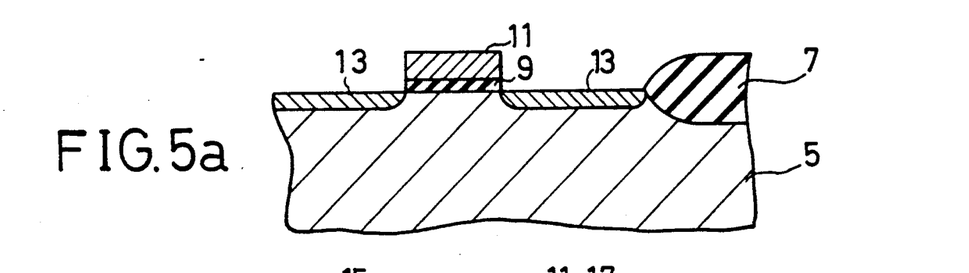
FIGS. 5(a) to 5(e) are sectional views showing manufacturing processes of a DRAM cell according to the present invention.

In FIG. 5(a), a P-type silicon substrate 5 has a resistivity of 10 ohms/cm. On the surface of the substrate 5, a thermal oxidation film 7 is selectively formed to separate elements from one another. A thin thermal oxidation film 9 which is a gate oxide film is formed. A first n+-type polysilicon film 11 which will be a gate electrode is formed and patterned through a usual photoetching process. With respect to the gate, an n⁻-type layer 13 is formed by an ion implantation method and self-aligns.

Figure 5B:
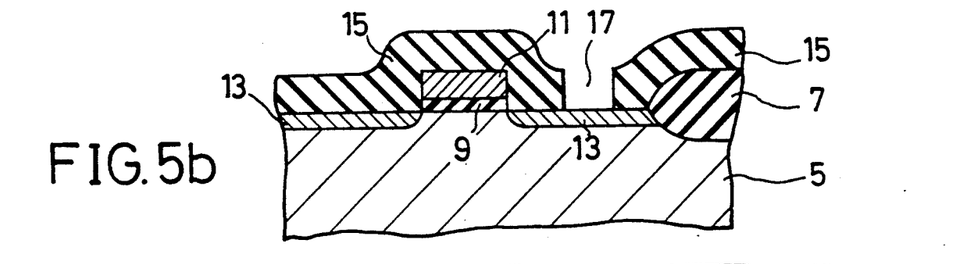

In FIG. 5(b), a thick CVD oxide film 15 is formed allover the surface. The usual photoetching process is carried out to form an opening portion 17 in contact with a part of the n⁻-type layer 13.

Figure 5C:
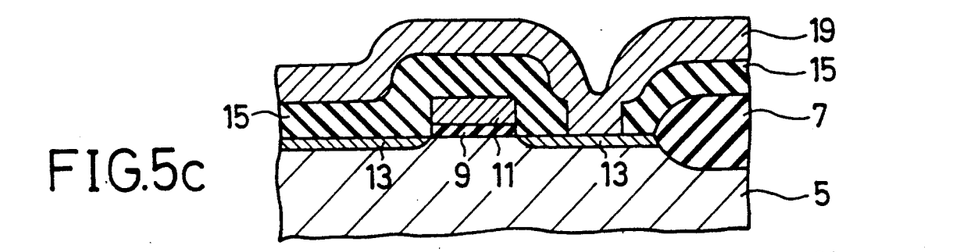

In FIG. 5(c), a second n+-type polysilicon film 19 is formed over the entire surface.

Figure 5D:
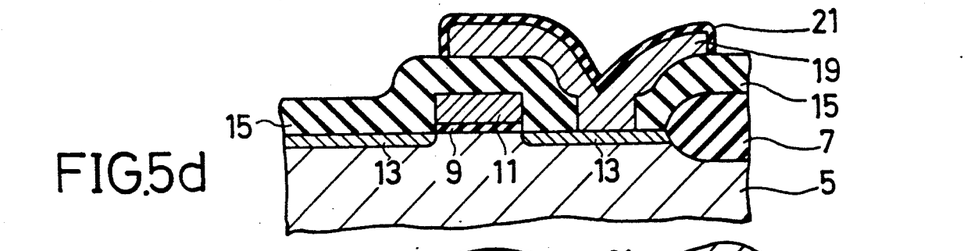

In FIG. 5(d), the usual photoetching process is carried out to pattern the n+-type polysilicon film 19 to form a required pattern. An insulation film 21 is formed as a capacitor insulation film. The insulation film 21 comprises a tantalum oxide containing a zirconium oxide and is formed in the thickness of 200 Å according to the CVD method by thermally decomposing pentaethoxytantalum and tetraethoxyzirconium under the condition that partial pressure rate is 100:1–2.

Figure 5E:
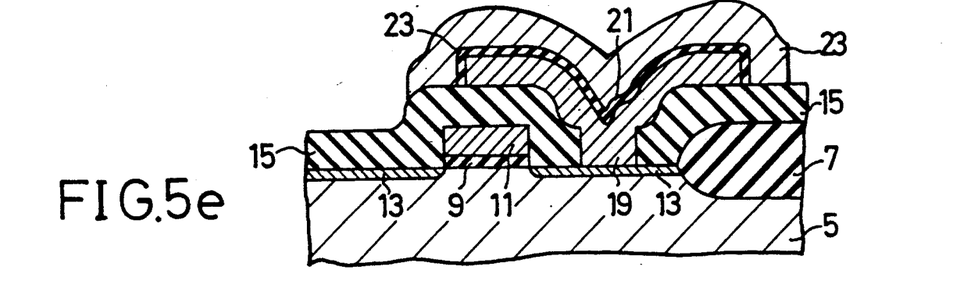

Finally, in FIG. 5(e), a third n+-type polysilicon film 23 is formed as a capacitor electrode over the entire surface and patterned through the usual photoetching process to complete a memory cell.

According to this example, the formed CVD high dielectric insulation film simultaneously contains oxides of tantalum and zirconium. The insulation film can improve insulation characteristics to remarkably improve reliability of elements.

Figure 6:
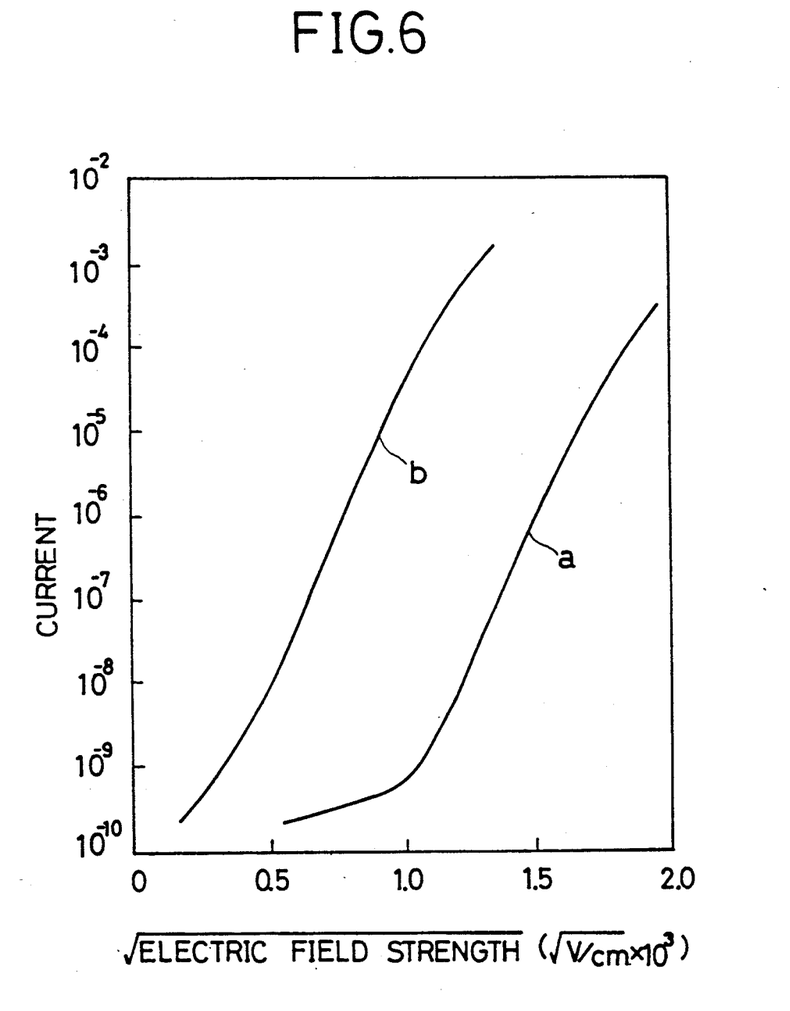
FIG. 6 is a view showing characteristic curves of leak currents and electric field strengths of the DRAM cell shown in FIGS. 5(a) to 5(e)

FIG. 6 is a view showing I–V characteristic curves. Curve (a) represents a capacitor formed according to the embodiment of the present invention of FIGS. 5(a) to 5(e), while curve (b) represents a capacitor formed with a conventional CVD high dielectric insulation film comprising only a tantalum oxide. As is apparent in the figure, the present invention reduces the leak current.

With reference to FIG. 7, a second example of the manufacturing process of a DRAM having stacked capacitor cells employing the dielectric insulation films of the present invention will be explained.

Figure 7A:
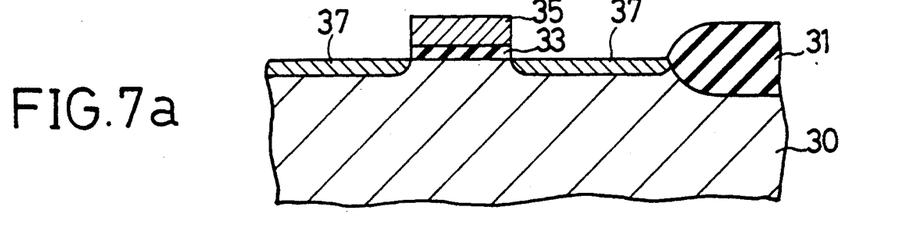
FIGS. 7(a) to 7(d) are sectional views showing manufacturing processes of another DRAM cell according to the present invention.

In FIG. 7(a), a P-type substrate 30 has a resistivity of 10 ohms/cm. On the surface of the substrate 30, a thermal oxidation film 31 is formed to separate elements from one another. A thin thermal oxidation film 33 is formed as a gate oxide film. A first n+-type polysilicon film 35 is formed as a gate electrode and patterned through a usual photoetching process. Then, an n⁻-type layer 37 is formed by an ion implantation method and self-aligns.

Figure 7B:
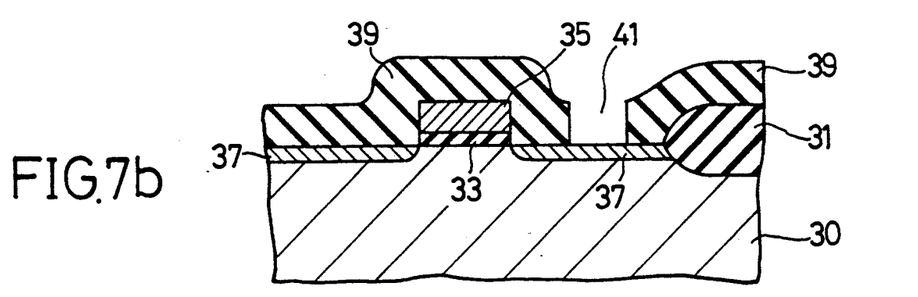

In FIG. 7(b), a thick CVD oxide film 39 is forced allover the surface. The usual photoetching process is carried out to form an opening portion 41 in contact with a part of the n⁻-type layer 37.

Figure 7C:
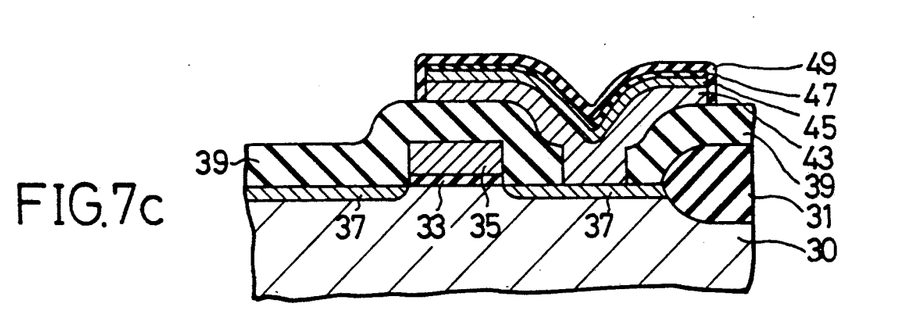

As shown in FIG. 7(c), a second n+-type polysilicon film 43 is formed over the surface. On the film 43, a tungsten film 45 is formed by a sputtering method and patterned through the photoetching process. On the tungsten film 45, a thin tungsten oxide (WO₂) film 47 is formed as a second insulation film. On the film 47, a dielectric insulation film 49 is formed as a first insulation film. The first insulation film 49 comprises Zr-added Ta₂O₅ and is formed by the CVD method. A dielectric constant of the second insulation film 47 is higher than that of the first insulation film 49.

The thin tungsten oxide (WO₂) film 47 may be formed by exposing the W film at about 300° C. in an oxygen atmosphere, or in plasma of low pressure, or by using WF₆ and O₂, or N₂O, or by other methods. The Ta₂O₅ film 49 may be formed by the CVD method, by a reactive sputtering method, or by other methods.

Figure 7D:
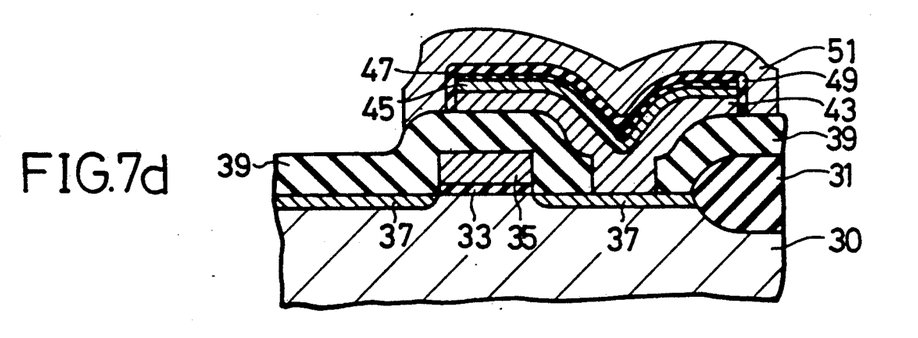

Finally, in FIG. 7(d), a second tungsten film 51 is formed as a capacitor electrode over the surface and patterned through the photoetching process to complete a memory cell.

Figure 8:
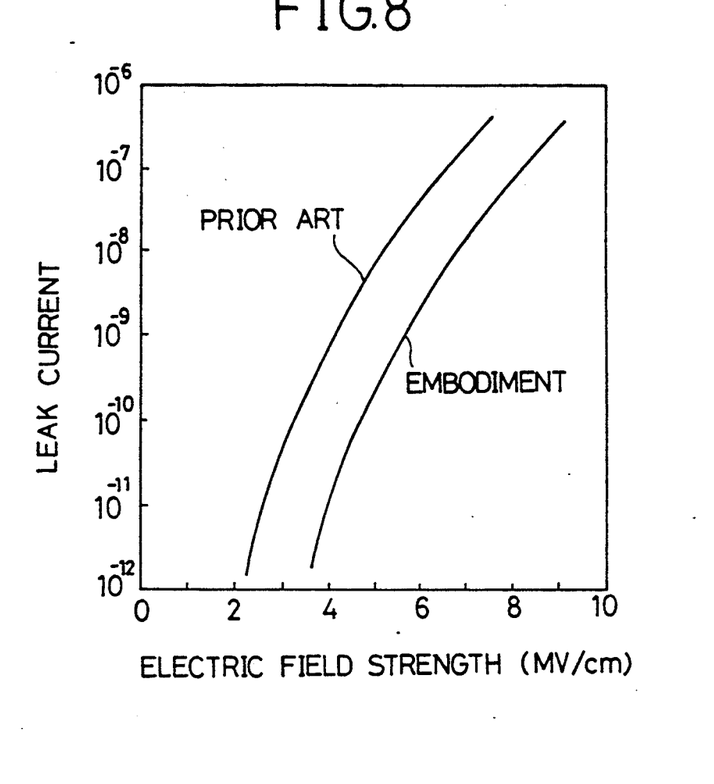
FIG. 8 is a view showing characteristic curves of leak currents and electric field strengths of the DRAM cell shown in FIGS. 7(a) to 7(d) and of a prior art example.

The effects of the second example will be explained. Leak characteristics of a stacked capacitor employing the tungsten oxide film (second insulation film) 47 whose dielectric constant is higher than that of the Zr-added Ta₂O₅ insulation film (first insulation film) 49 and which is formed at an interface of the Zr-added Ta₂O₅ film are compared with those of a conventional stacked capacitor formed only with a Ta₂O₅ film on W in FIG. 8. As is apparent in this figure, leak currents of the insulation film of the present invention are smaller than those of the conventional film. Hf-added Ta₂O₅ insulation film shows the same characteristics as Zr-added Ta₂O₅ film.

In this example, an decrease in capacitance due to the formation of the tungsten oxide film 47 is small. The reason for this is that a dielectric constant of the tungsten oxide film is large. The tungsten oxide film may be made of WO₂, WO₃, etc., in which WO₂ has a large dielectric constant of about 40.

Figure 9:
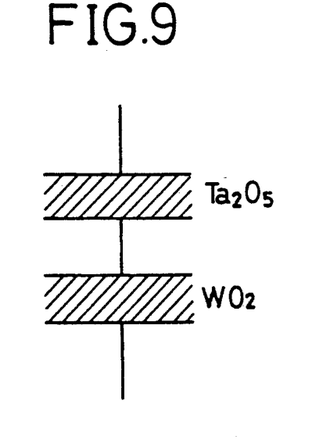
FIG. 9 is a view schematically showing constitution of a capacitor in the DRAM cell shown in FIGS. 7(a) to 7(d)
Figure 10:
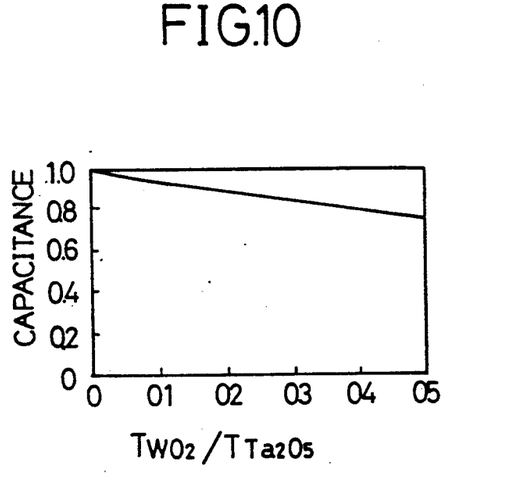
FIG. 10 is a diagram showing relations between thickness and capacitance of $WO_2$ films in the DRAM cell shown in FIGS. 7(a) to 7(d).

In FIG. 9, a two-layer insulation film structure of Ta₂O₅ and WO₂ forms two series connected capacitors. Relations of total capacitance and the film thickness ratio of WO₂ and Ta₂O₅ are shown in FIG. 10. The capacitance on an ordinate of the figure is standardized with a capacitor formed only with the Ta₂O₅ film being one. As is seen in the figure, even if the WO₂ of larger dielectric constant is formed at the interface, a decrease in the total capacitance is small. Accordingly, the embodiment of FIG. 8 can provide a capacitor having a high dielectric constant and a small leak current.

Although the embodiment has employed Ta₂O₅ and tungsten oxide films, other insulation materials may be employed. For example, a titanium oxide film having a large dielectric constant may be formed at the interface to provide a structure of Ta₂O₅ and titanium oxide films.

The present invention is applicable not only for the stacked capacitors explained with reference to the embodiment, but also for general capacitors comprising transition metal oxide films formed on silicon electrodes or on metal electrodes.

In summary, according to the embodiments of the present invention, pieces of dissimilar metal elements are added to a metal oxide of high dielectric constant. An ionic charge number of the dissimilar metal element is smaller by one than that of the metal oxide of high dielectric constant. Due to the addition of the dissimilar metal element, a leak current of the mother metal oxide can be remarkably reduced. With this metal oxide, there is provided a capacitor which is properly mounted on a VLSI chip, etc., and has a small area, large capacity and small leak current.

The first example of the embodiment of the present invention can form an insulation film which has a high dielectric constant, a small leak current and an excellent step coverage property. Accordingly, semiconductor devices having excellent characteristics are provided.

According to the second example of the embodiment of the present invention, an insulation film layer having larger dielectric constant is disposed at an interface between a transition metal oxide film and an electrode to provide a capacitor whose capacitance does not decrease substantially and which has a low leak current. Accordingly, highly integrated semiconductor elements are provided with high reliability.

Various modifications will become possible for those skilled in the art after receiving the teachings of the present disclosure without departing from the scope thereof.

What is claimed is:

1. A semiconductor device comprising:
   a lower electrode made of a simple substance of a metallic element and formed on a semiconductor substrate;
   a first insulation film formed on said lower electrode, said first insulation film composed of an oxide of a transition metal and pieces of a dissimilar metal element added to the oxide, the positive charge number under an ionized state of the dissimilar metal element being smaller by one than that of the transition metal, the dissimilar metal element having only a single valence to fix said positive charge number;
   an upper electrode formed on said first insulation film; and
   a second insulation film disposed between said first insulation film and said lower electrode or between said first insulation film and said upper electrode, said second insulation film being composed of a metal oxide having a dielectric constant higher than that of said first insulation film.

2. The semiconductor device as claimed in claim 1, wherein the quantity of said added dissimilar metal element is less than five atomic percent of the metal in said metal oxide.

3. The semiconductor device as claimed in claim 1, wherein said metal oxide is one of $Ta_2O_5$ and $Nb_2O_5$, and said added dissimilar metal element is at least one of Zr and Hf.

4. The semiconductor device as claimed in claim 1, wherein said metal oxide is one of $ZrO_2$, $HfO_2$ and $TiO_2$, and said added dissimilar metal element is at least one of Sc, Y and La.

5. The semiconductor device as claimed in claim 1, wherein said first insulation film is a Zr-added $Ta_2O_5$ or Hf-added $Ta_2O_5$ film, said upper and lower electrodes are made of W, and said second insulation film is a tungsten oxide film.

6. The semiconductor device as claimed in claim 5, wherein said tungsten oxide film is made from $WO_2$.

7. The semiconductor device as claimed in claim 6, wherein said tungsten oxide film is made through oxidation of said lower electrode.

8. The semiconductor device as claimed in claim 1, wherein said second insulation film is a titanium oxide film.

9. The semiconductor device as claimed in claim 1, wherein the quantity of the added dissimilar metal element is less than five atomic percent of a transition metal which is composing said first insulation film.

10. A semiconductor device comprising:
    a semiconductor substrate;
    a lower electrode formed on said substrate;
    a dielectric film made of an oxide material of niobium or tantalum on said lower electrode; and
    an upper electrode formed on said dielectric film and insulated from said lower electrode through said dielectric film interposed therebetween in order to form a capacitance,
    wherein said oxide material of niobium or tantalum is given an additive of zirconium or hafnium at no higher than 5 atomic %.

11. A semiconductor device comprising:
    a semiconductor substrate;
    a lower electrode formed on said substrate;
    a dielectric film made of an oxide material of zirconium, hafnium or titanium on said lower electrode; and
    an upper electrode formed on said dielectric film and insulated from said lower electrode through said dielectric film interposed therebetween in order to form a capacitance,
    wherein said oxide material of zirconium, hafnium or titanium is given an additive of scandium or yttrium at no higher than 5 atomic %.

12. A semiconductor device comprising:
    a semiconductor substrate;
    a lower electrode formed on said substrate;
    a dielectric film made of an oxide material of zirconium, hafnium or titanium on said lower electrode; and
    an upper electrode formed on said dielectric film and insulated from said lower electrode through said dielectric film interposed therebetween to form a capacitance,
    wherein said oxide material of zirconium, hafnium or titanium has an additive of scandium or yttrium to suppress current leakage through said dielectric film between said upper and lower electrodes.

* * * * *